United States Patent
Shubat (10) Patent No.: US 6,744,661 B1
(45) Date of Patent: Jun. 1, 2004

(54) RADIATION-HARDENED STATIC MEMORY CELL USING ISOLATION TECHNOLOGY

(75) Inventor: Alex Shubat, Fremont, CA (US)

(73) Assignee: Virage Logic Corp., Fremont, CA (US)

( * ) Notice: Subject to any disclaimer, the term of this patent is extended or adjusted under 35 U.S.C. 154(b) by 51 days.

(21) Appl. No.: 10/146,523

(22) Filed: May 15, 2002

(51) Int. Cl.[7] .............................................. G11C 11/00
(52) U.S. Cl. .................. 365/156; 365/154; 365/185.07; 365/185.18
(58) Field of Search ................................ 365/156, 154, 365/185.07, 185.18

(56) References Cited

U.S. PATENT DOCUMENTS

| | | | | |
|---|---|---|---|---|
| 5,046,044 A | * | 9/1991 | Houston et al. | 365/156 |
| 5,239,503 A | * | 8/1993 | Guo et al. | 365/156 |
| 5,940,318 A | | 8/1999 | Bessot | 365/154 |
| 6,111,780 A | * | 8/2000 | Bertin | 365/154 |
| 6,172,907 B1 | * | 1/2001 | Jenne | 365/185.18 |
| 6,215,694 B1 | * | 4/2001 | Li et al. | 365/156 |
| 6,285,580 B1 | * | 9/2001 | Phan et al. | 365/156 |

OTHER PUBLICATIONS

"Identification of Soft–Error Sensitive Junction in SRAM's Using a Single ion Microprobe," Takeshi Matsukawa et al. IEEE Electron Device Letters, vol. 15, No. 6, pp 199–201. Jun. 1994.

"Upset Hardened Memory Design for Submicron CMOS Technology," T. Calin et al. IEEE Transactions on Nuclear Science, vol. 43, No. 6, pp. 2874–2878. Dec. 1996.

"Control Your Failures in Time and Keep Customers Happy," Alex Shubat. Electronic Design, Oct. 15, 2001, p. 50.

"Alpha–SER Modeling & Simulation for Sub–O.25μm CMOS Technology," Changhong Dai et al. Logic Technology Development, Intel Corporation.

* cited by examiner

Primary Examiner—Richard Elms
Assistant Examiner—Toan Le
(74) Attorney, Agent, or Firm—Danamraj & Youst, P.C.

(57) ABSTRACT

A static memory cell having reduced susceptibility to soft error events, wherein data storage nodes are hardened by way of junction isolation. The memory cell is comprised of a pair of cross-coupled inverters. A first inverter is formed with a first N-channel Metal Oxide Semiconductor (NMOS) device and a first P-channel MOS (PMOS) device, with a first isolation device disposed therebetween. A second inverter is cross-coupled to the first inverter to form a pair of data storage nodes therein. The second inverter is also provided with a second isolation device disposed between its pair of NMOS and PMOS devices. A first data storage node is formed at a coupling between the first PMOS device and the first isolation device and a second data storage node is formed at a coupling between the second PMOS device and the second isolation device.

24 Claims, 7 Drawing Sheets

RADIATION-HARDENED STATIC MEMORY CELL USING ISOLATION TECHNOLOGY

BACKGROUND OF THE INVENTION

1. Technical Field of the Invention

The present invention relates generally to semiconductor memories. More particularly, and not by way of any limitation, the present invention is directed to the design of a radiation-hardened static memory cell having improved immunity to soft errors.

2. Description of Related Art

With the advent of smaller 0.13- and 0.10 µm semiconductor geometries, and the shift from logic-based to memory-dominant chips, designers must watch out for soft errors. These errors result whenever the charges generated by extraneous sources exceed a critical charge required to flip data stored in a bit cell (i.e., upset event). Common causes of this discharge problem include, for example, α-particle bombardment, metal coupling, and system noise.

Until recently, soft errors were mainly a problem in aerospace applications because these errors increase with altitude and exposure to radiation. That is no longer the case with the spread of memory technology into commercial, consumer, and industrial applications, where downtime caused by soft errors can be very costly.

Except for dynamic random access memories or DRAMs, memory cells in geometries larger than very deep submicron (VDSM) line widths have been known to be relatively insensitive to α-particle radiation. On the other hand, DRAMs designed in 0.13 µm or smaller technologies are very susceptible to soft errors. Even static random access memories SRAMs are becoming sensitive to soft errors because of their small memory bit cells, where a logic state of 0 or 1 is represented by a very small charge.

Sources of harmful radiation can vary greatly depending on the application. For example, a chip's packaging, or just cosmic radiation, can generate α particles. These are doubly ionized helium particles that can penetrate 20 to 30 µm of Silicon and create electron-hole pairs. A single a particle can generate as many as a million electron-hole pairs for a penetration of about 25 µm into Silicon.

With memory cells being so small at the VDSM geometries seen today, these electron-hole pairs can accumulate to create a charge that disrupts stored information. The amount of charge that represents a bit value in a 0.13 µm SRAM cell is about 1/16 of what is required in 0.25 µm geometries, making the cells almost an order of magnitude more susceptible. DRAMs, however, have always had less charge and been more vulnerable to soft errors, even before the advent of VDSM technology.

Failure rates due to soft errors are measured as Failures in Time (FITs). An FIT is one failure in a billion hours. In a system with 50 components, if the system can only fail once a year, every component must meet a design specification of 2281 FITs. Fortunately, soft errors can be prevented or corrected because, although there's data loss, there's no damage to the underlying memory devices. Through advancements in packaging, memory design, and process techniques, soft-error rates from alpha-particle bombardment can be avoided. In packaging, the use of special radiation-absorbing die coats, materials with lower lead content (lead emits α particles), and keeping the bumps in a ball-grid array (BGA) away from the memory are all very effective ways to reduce soft errors.

Memory design techniques can be improved to reduce soft errors as well. Increasing transistor size will increase cell storage capacitance, and adding RC delays can increase cell-flip times. Some of the other design hardening techniques are based on storage latch duplication and use state-restoring feedback delays. Whereas the current design techniques could represent a viable alternative to achieve upset immunity in submicron CMOS designs, unfortunately they are beset with several drawbacks that make them inapplicable to high density circuit architectures: high area overhead, high power dissipation (due to the use of NMOS and/or PMOS inverters, with inherently high leakage currents) and critically-ratioed transistor sizing in order to achieve upset immunity.

SUMMARY OF THE INVENTION

Accordingly, the present invention advantageously provides a static memory cell having reduced susceptibility to soft error events, wherein data storage nodes are hardened by way of junction isolation. In one implementation, the memory cell is preferably provided to be an 8T SRAM device. A first inverter is formed with a first N-channel Metal Oxide Semiconductor (NMOS) device and a first P-channel MOS (PMOS) device, with a first isolation device disposed therebetween. A second inverter is cross-coupled to the first inverter to form a pair of data storage nodes therein. The second inverter is also provided with a second isolation device disposed between its pair of NMOS and PMOS devices. A first data storage node is formed at a coupling between the first PMOS device and the first isolation device and a second data storage node is formed at a coupling between the second PMOS device and the second isolation device. In a presently preferred exemplary embodiment, the isolation devices are comprised of PMOS devices, whereby all-PMOS data storage nodes are obtained. The N-well junctions of the PMOS devices help harden the data nodes against a soft error event such as, e.g., radiation.

As a further variation, the present invention provides an 8T SPAM cell having two or more access ports. Each of the two complementary data storage nodes is coupled to an equal number of access devices, wherein each pair (one coupled to one data storage node and the other coupled to the complementary data storage node) is operable as a separate access port.

In another aspect, the present invention is directed to a register file cell having reduced susceptibility to soft error events. The register file cell preferably comprises a hardened static memory cell such as the 8T memory cell set forth above. A separate read and write ports are provided for supporting dual port access to the data nodes. In further implementations, two or more read ports may be provided.

The PMOS isolation devices can be operable in various modes under different biasing conditions. In one exemplary implementation, the gates of the PMOS isolation devices are coupled to $V_{SS}$. In another implementation, the gates are biased at a predetermined negative voltage level, e.g., at around −0.5V to −1.0V. In a still further implementation, the PMOS isolation devices may be provided as depletion mode devices.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
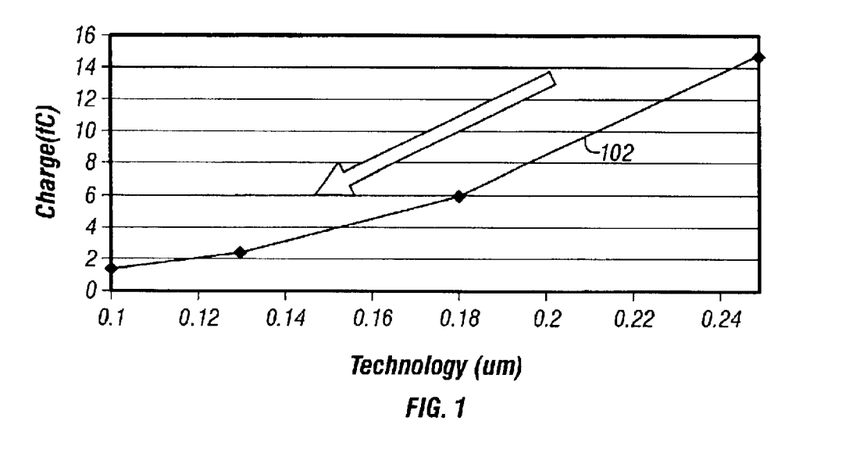
FIG. 1 depicts a functional relationship between bit cell geometry and charge scaling for a typical SRAM design.

In the drawings, like or similar elements are designated with identical reference numerals throughout the several views thereof, and the various elements depicted are not necessarily drawn to scale. Referring now to FIG. 1, depicted therein is a functional relationship between bit cell geometry and charge scaling for a typical SRAM design. The bit cell geometry technology (in $\mu$m) is shown on the X-axis and the charge required to maintain data on the SRAM cell data nodes is shown on the Y-axis (in fC). As the scaling curve 102 graphically illustrates, a typical 0.25 $\mu$m cell has a charge of about 15 fC on its data nodes. When the geometries shrink as the technology scales, the data node's capacitance is reduced significantly. In addition, the operating voltages of the memory cells are also lowered at reduced geometries. For example, at line widths of about 0.13 $\mu$m, the active area of the cell is decreased dramatically and the operating voltages ($V_{DD}$) of around 1.0V are typically implemented. As a consequence, the Coulombic charge (q=CV) of the data node goes down to about 3 to 5 fC. An event such as exposure to $\alpha$-radiation, which particles carry an effective charge, can therefore cause an upset charge pulse that is relatively large at the data nodes of small geometry devices. Such upset charge pulses can drive the data node's voltage levels past its write trip potential, which may thereby cause a data logic reversal in the cell.

Figure 2:
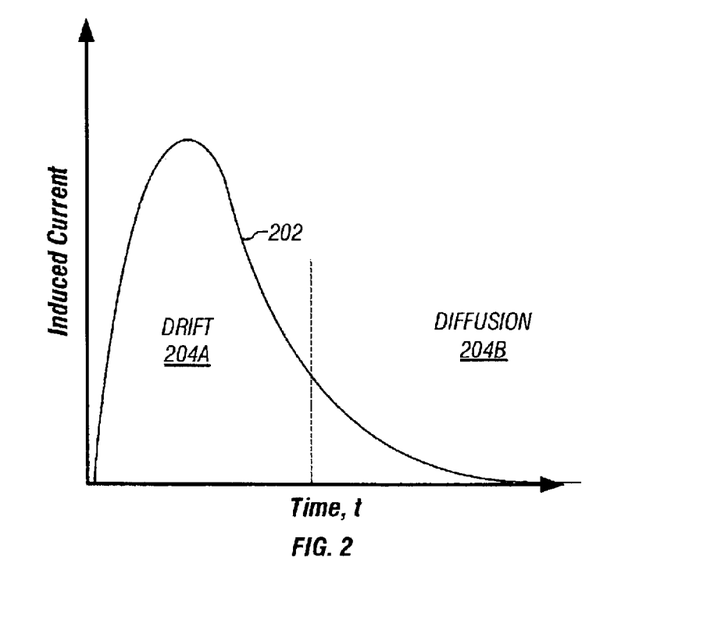
FIG. 2 depicts a graphical representation of the induced current phenomenon in a semiconductor device.

A brief background of the theoretical underpinnings of a radiation-based soft error event is set forth below in order to help better understand the present invention. When $\alpha$ particles strike a semiconductor substrate, ionization takes place in the substrate material with varying electron potential rates depending on the substrate chemistry. For example, ionization rates of approximately 8 eV are possible for Silicon substrates. The ionization rates typically increase as the $\alpha$ particles lose energy during their penetration into the substrate. It is commonly known that $\alpha$ particles can penetrate fairly deep into the substrate, up to 30 $\mu$m or thereabouts. Particularly, when the $\alpha$ particles strike N+/P− or P+/N− junctions, two phenomena occur: (i) generation of drift current due to minority carriers in the depletion region; and (ii) diffusion of the remaining carriers that have not already recombined. As a result, there is an induced current that is comprised of two distinct phases: (a) initial drift current phase due to charge generation in the depletion region; and (b) follow-on diffusion-dominated current. FIG. 2 depicts these two phases in a radiation-induced current curve 202 in an exemplary semiconductor device, wherein reference numeral 204A refers to the drift phase and reference numeral 204B refers to the diffusion phase. It can be seen that the induced current falls off exponentially due to recombination of the hole-electron pairs, which can therefore be adequately modeled by a triangular current pulse.

It is also well-known that the effective depth of a depletion region in a device is distorted by the striking $\alpha$ particles due to what is referred to as the "funneling effect". Accordingly, the junction regions of a semiconductor device having depletion areas are considered to be particularly radiation-sensitive. It is further known that the diffusion lengths associated with carriers generated by ionic particle incidence are different for the two types of carriers. Whereas the induced electrons have a diffusion length ($L_N$) of about 20 $\mu$M, a diffusion length ($L_P$) of about 10 $\mu$M is estimated for holes (i.e., $L_N$>$L_P$). Furthermore, the P+/N− junctions of PMOS devices are more immune to the disturbances caused by the induced currents due to the N-well surrounding such junctions, which acts as a "collector" for such currents. As will be seen in greater detail hereinbelow, these properties will be advantageously utilized in designing a novel radiation-hardened memory cell in accordance with the teachings of the present invention.

Figure 3:
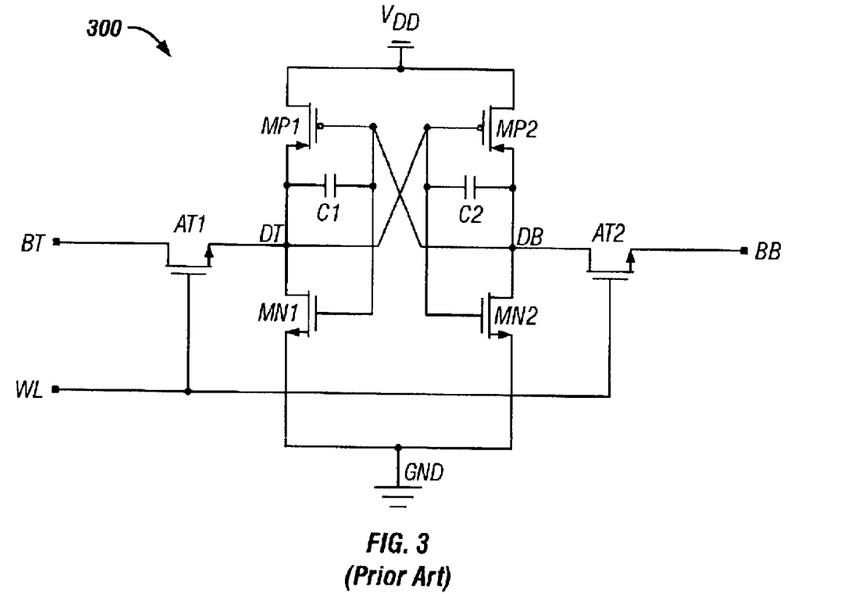
FIG. 3 (Prior Art) depicts an exemplary SRAM cell using a conventional hardening scheme.

FIG. 3 depicts an exemplary 6T SRAM cell 300 using a conventional hardening scheme for achieving immunity against radiation-induced soft errors. Transistors MN1 (NMOS) and MP1 (PMOS) form a typical CMOS inverter which is cross-coupled to another CMOS inverter formed from MN2 and MP2 transistors. Complementary data storage nodes DT and DB are formed thereby for storing binary values in conventional manner. In the exemplary embodiment shown, data nodes DT and DB are coupled to a bitline pair (BT and BB) via NMOS access devices AT1 and AT2, respectively, for accessing the data in well-known fashion when a selected wordline WL is driven high.

Those skilled in the art should readily recognize that each of the DT and DB nodes is coupled to two NMOS devices and a PMOS device, and is particularly susceptible to soft errors because each junction associated therewith is prone to radiation-induced disturbances. For instance, DT node is associated with one P+/N− junction due to MP1 device, one N+/P− junction due to MN1 device and one N+/P− junction due to AT1 device, wherein the N+/P− junctions are particularly prone to an upset event. In a conventional design technique, accordingly, the data nodes are hardened by increasing their capacitance, which could be implemented by coupling actual capacitors C1 and C2, respectively, or by using parasitic capacitive effects of additional active devices. However, as pointed out in the Background section of the present patent application, such conventional techniques of capacitive hardening suffer from various deficiencies and drawbacks. Further, although by providing PMOS-based access devices one could improve the soft error immunity of the data storage nodes (because of the extra P+/N− junction), there is still one N+/P− junction due to NMOS devices of the cross-coupled inverters, which is still susceptible to radiation-induced currents.

Figure 4A:
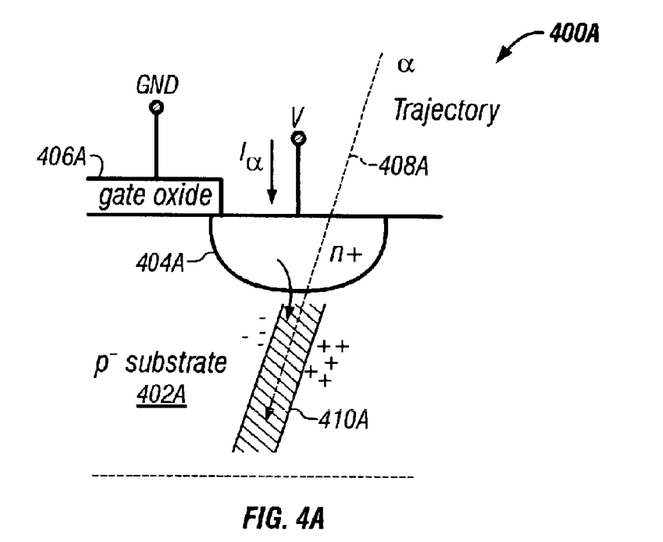
FIGS. 4A and 4B depict the funneling effect phenomenon in NMOS and PMOS devices, respectively.
Figure 4B:
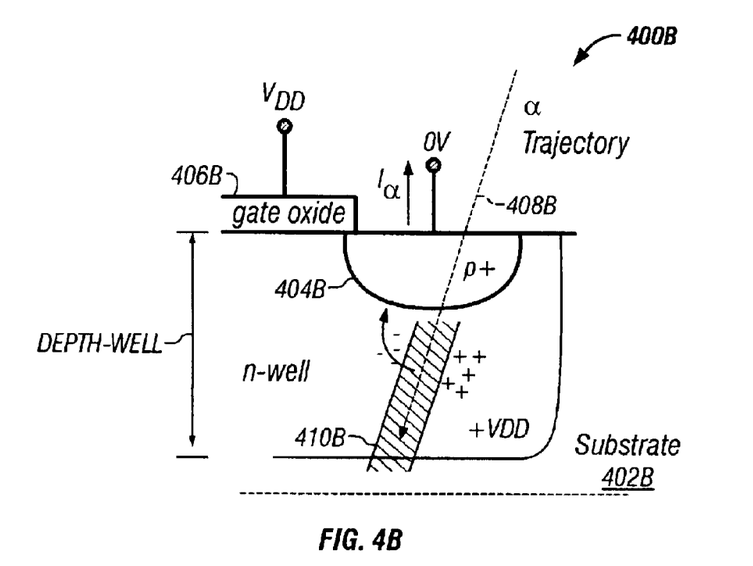

FIGS. 4A and 4B depict the funneling effect phenomenon of induced current in NMOS and PMOS devices, respectively. Reference numeral 400A refers generally to an NMOS device formed in a P− substrate 402A, wherein N+ doped areas 404A are provided for source and drain regions. Gate electrode 406A is coupled to the ground potential, which can be modulated for turning the device ON. Reference numeral 408A refers to a hypothetical trajectory of the incident a radiation which penetrates through the N+/P− junction, thereby causing ionization in the depletion region. Reference numeral 410A refers to the funneling area (i.e., distorted depletion region) caused due to the ionization in the substrate. $I_\alpha$, the induced current, is drawn into the semiconductor device from the voltage source coupled to the electrode.

Analogously, reference numeral 400B in FIG. 4B refers generally to a PMOS device formed in an N-well formed in the substrate 402B, wherein P+ doped areas 404B are provided for source and drain regions. Gate electrode 406B is coupled to a rail voltage $V_{DD}$, which can be modulated for turning the device ON. Again, reference numeral 408B refers to a hypothetical trajectory of the incident α radiation which penetrates through the P+/N− junction, thereby causing ionization in the N-well region (approximately about 1 μM in thickness) as well as the substrate. Reference numeral 410B refers to the funneling area caused due to the ionization in these regions. $I_\alpha$, the induced current, is drawn out from the semiconductor device to the electrode maintained at zero potential. However, as pointed out in the foregoing discussion, the N-well boundary in the P− substrate operates as a collector for the induced charge, thereby effectively limiting the amount of current disturbance on the electrode. Thus, it should be appreciated that the P+/N− junctions of PMOS devices are inherently more robust with respect to withstanding the effects of radiation-induced currents. Moreover, the junction depth of the well (DEPTH-WELL) can be advantageously manipulated in order to modulate the radiation hardness effect to suit different applications in conjunction with the teachings contained herein.

Figure 5A:
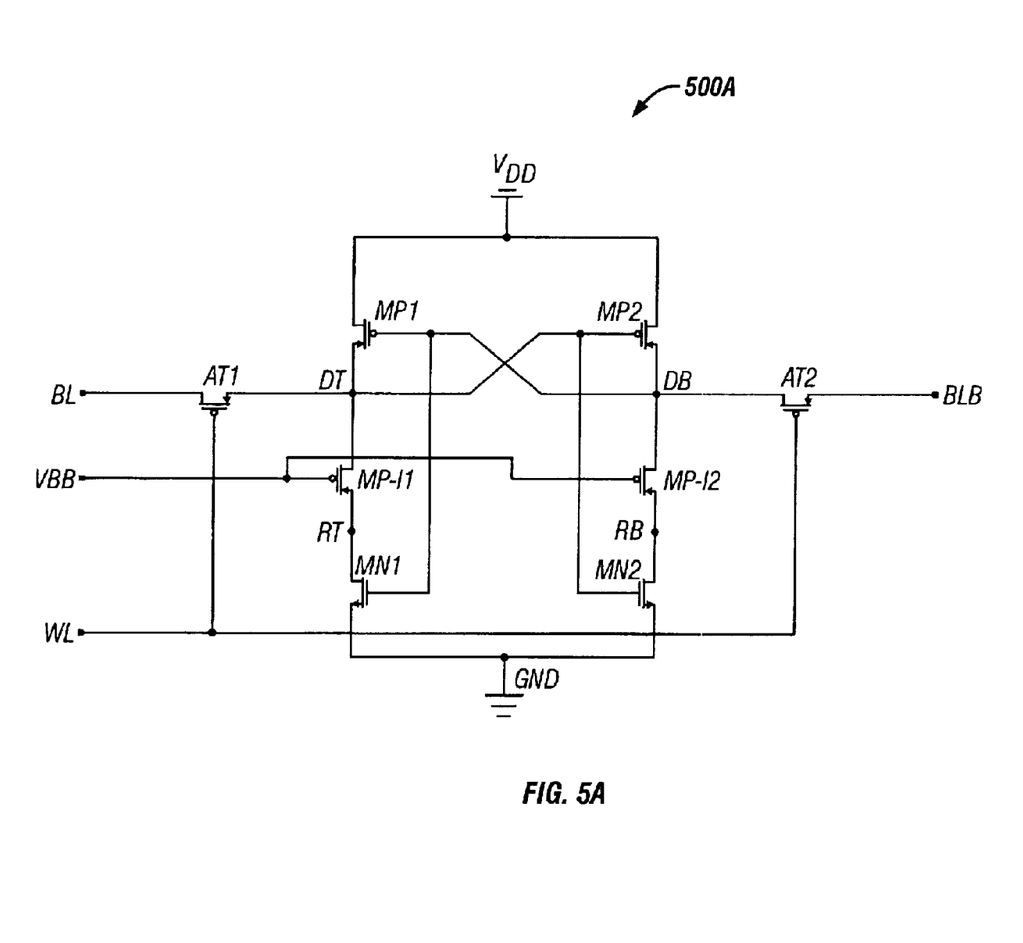
FIGS. 5A and 5B depict an exemplary single-port, 8T SRAM cell in accordance with the teachings of the present invention.
Figure 5B:
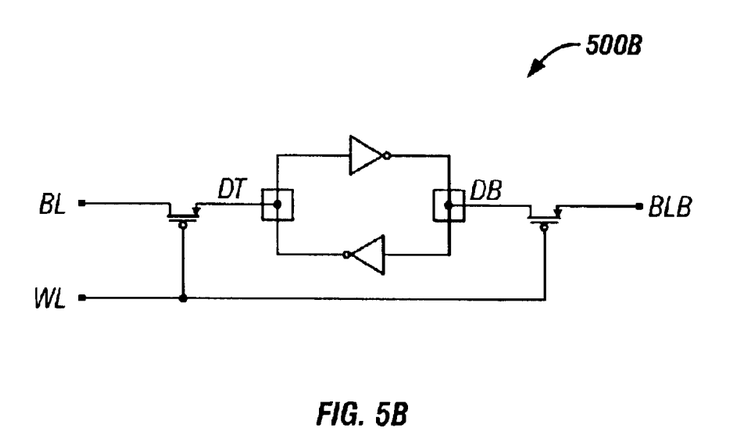

Accordingly, the present invention provides a memory cell design wherein the data storage nodes are associated with "all PMOS" junctions in order to achieve increased soft error immunity. Such a design may be referred to as a "junction isolated" memory cell, which can be embodied in any known static memory cell architecture. FIGS. 5A and 5B depict an exemplary single-port, 8T SRAM cell provided in accordance with one aspect of the present invention. Reference numeral 500A refers to the single-port 8T SRAM cell in its "expanded version," wherein a cross-coupled inverter arrangement having data nodes (DT and DB) is radiation-hardened for providing enhanced soft error immunity. A first inverter is formed with a first NMOS device (MN1) and a first PMOS device (MP1). A second inverter is formed with a second NMOS device (MN2) and a second PMOS device (MP2). The first and second inverters are cross-coupled together to support a pair of data storage nodes therein. A first isolation device (MP-I1) is disposed between the first NMOS and PMOS devices such that a first data storage node (DT) is formed at a coupling between the first PMOS device MP1 and the first isolation device MP-I1. In similar fashion, a second isolation device (MP-I2) is disposed between the second NMOS and PMOS devices of the second inverter such that a second data storage node (DB) is formed at a coupling between the second PMOS device MP2 and the second isolation device MP-I2. Preferably, the first and second isolation devices are comprised of PMOS devices whose gates are tied together at a common node that is operable to be biased at a predetermined level ($V_{BB}$).

A PMOS device is operable as a first access device AT1 coupled to the first data storage node. Another PMOS device is operable as a second access device AT2 coupled to the second data storage node. AT1 and AT2 devices are respectively coupled to a bitline pair Bitline (BL) and Bitline Bar (BLB) nodes for accessing the data storage nodes via the single port formed thereby. An intermediate node RT is formed at a coupling between the first isolation device MP-I1 and the first NMOS device MN1 of the first inverter. Similarly, a complementary intermediate node RB is formed at a coupling between the second isolation device MP-I2 and the second NMOS device MN2 of the second inverter.

Various biasing options are possible with respect to the PMOS isolation devices provided in accordance herewith. Each biasing option will have a different effect on the differential voltage swing that is sensed based on the logic levels stored at DT and DB nodes. When $V_{BB}$ is at $V_{SS}$ in the enhanced mode operation of the isolation devices, the data storage nodes will provide a voltage swing ranging from $V_{SS}+V_T$ (logic LOW) to $V_{DD}$ (logic HIGH). Also in the enhanced mode operation, when $V_{BB}$ is set to the threshold voltage of the isolation devices (i.e., at around −0.5V to −1.0V), the voltage swing on the data storage nodes will be from $V_{SS}$ to $V_{DD}$. In the depletion mode, however, when $V_{BB}$ is set to $V_{SS}$, the storage nodes DT and DB will be able to reach ground, thereby providing a full differential swing (from $V_{SS}$ to $V_{DD}$) also.

It should be seen that the data storage nodes (i.e., DT and DB nodes) are associated with all PMOS junctions (i.e., three P+/N− junctions due to one PMOS access device, one PMOS isolation device, and one PMOS device of the cross-coupled inverter), thereby providing enhanced hardening against soft error events. Further, although radiation can still strike the intermediate nodes (RT and RB nodes, which still have an NMOS junction) to upset the voltage levels and potentially cross the write trip voltages thereat, such effects will not be transferred to the DT and DB nodes because the isolation devices are much weaker by design in comparison to the other devices of the cross-coupled inverters. In other words, DT and DB storage nodes are shielded from the effects of any radiation strikes at RT and RB nodes. This important feature provides the basis for the advantageous aspects of the present invention.

Referring now to FIG. 5B in particular, shown therein—in an abbreviated form—is the exemplary 8T SRAM cell described in detail hereinabove. Reference numeral 500B refers to the 8T cell wherein the cross-coupled inverter arrangement is illustrated in a compact symbolic form. Each of the radiation-hardened DB and DT nodes is exemplified as a node with a square ("☐") symbol around it. For purposes of clarity, the biasing voltage path, i.e., $V_{BB}$ path, is not illustrated herein.

Figure 5C:
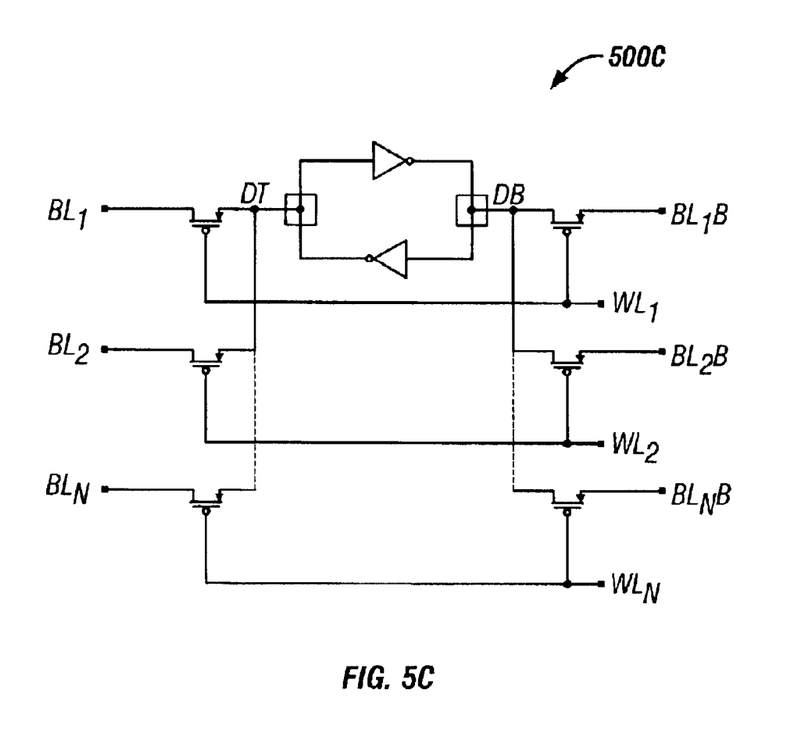
FIG. 5C depicts an exemplary N-port, 8T SRAM cell in accordance with the teachings of the present invention.

FIG. 5C depicts an exemplary N-port, 8T SRAM cell 500C provided in accordance with the teachings of the present invention. Essentially, the hardened, single-port 8T cell described above is suitably modified such that two or more access ports may be supported. As illustrated, a first bitline pair $BL_1$ and $BL_1B$ is operable as a single access port (read/write port) in conjunction with $WL_1$ to access' the DT and DB nodes. Similarly, another bitline pair $BL_2$ and $BL_2B$ is operable as a second read/write port in conjunction with $WL_2$ to access the DT and DB nodes of the SRAM cell. Up to N read/write ports, each being operable with a separate WL signal, may be provided accordingly.

Figure 6A:
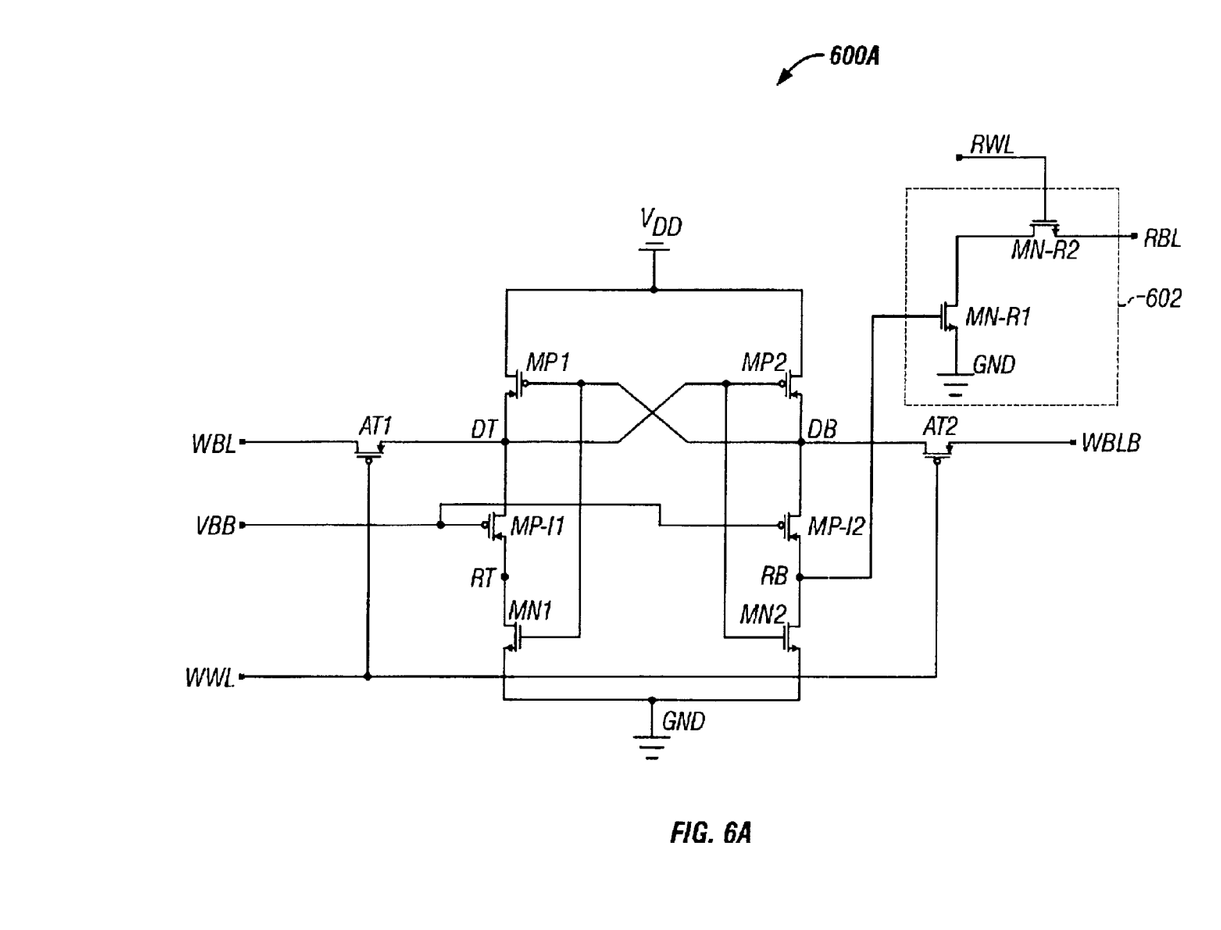
FIG. 6A depicts an exemplary 10T, dual-port register file (RF) cell in accordance with the teachings of the present invention.

FIG. 6A depicts an exemplary 10T, dual-port register file (RF) cell 600A provided in accordance with another aspect of the present invention. Those skilled in the art should readily recognize that the exemplary RF cell 600A is a modification of the hardened 8T cell described above, which modification includes the provision of a separate read-port circuit 602. Accordingly, the cross-coupled inverter arrangement includes a first inverter having MN1 and MP1 devices and a second inverter having MN2 and MP2 devices. Also, similar to the 8T cell arrangement, radiation hardening is provided by way of first and second isolation devices, MP-I1 and MP-I2, respectively, whose gates are tied together at a common node that is operable to be biased at a predetermined level ($V_{BB}$). Various biasing modes are thus possible in the hardened 10T RF cell as well.

A PMOS device is operable as a first access device AT1 coupled to the first data storage node, i.e., DT node. Another PMOS device is operable as a second access device AT2 coupled to the second data storage node (DB node). AT1 and AT2 devices are respectively coupled to Write Bitline (WBL) and Write Bitline Bar (WBLB) nodes that operate as a write port of the RF cell 500. Similar to the 8T SRAM cell arrangement, an intermediate node RT is formed at a coupling between the first isolation device MP-I1 and the first NMOS device MN1 of the first inverter. A complementary intermediate node RB is formed at a coupling between the second isolation device MP-I2 and the second NMOS device MN2 of the second inverter. RB node is preferably coupled to two NMOS devices (MN-R1 and MN-R2) operating to drive Read Wordline (RWL) and Read Bitline (RBL) nodes. RWL and RBL nodes operate as a read port of the RF cell 500 and, accordingly, MN-R1 and MN-R2 devices of read port circuit 602 are appropriately sized in order to support fast read operations.

Figure 6B:
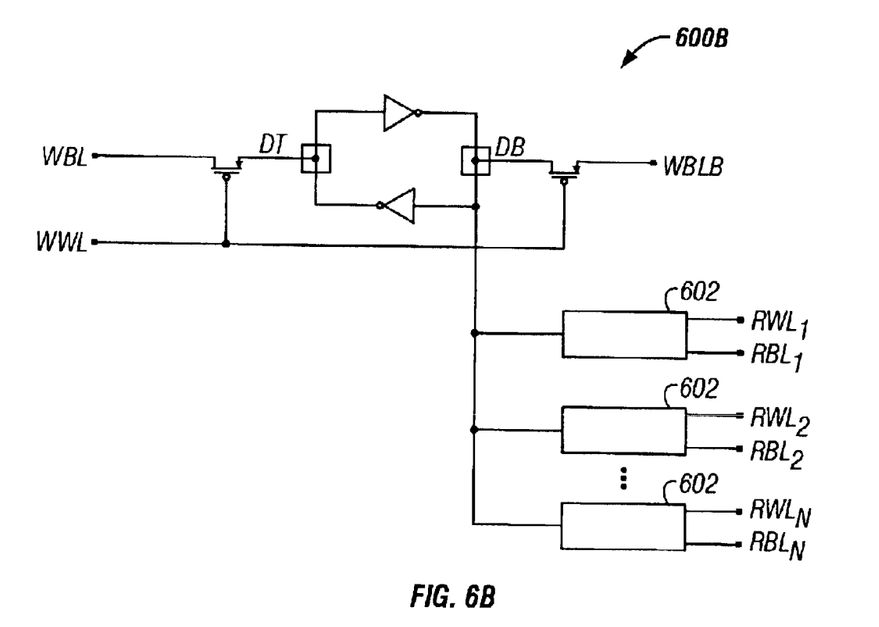
FIG. 6B depicts an exemplary 10T, N read-port RF cell in accordance with the teachings of the present invention.

FIG. 6B depicts an exemplary 10T, N read-port RF cell 600B in accordance with the teachings of the present invention, wherein the cross-coupled inverter arrangement is provided in a compact symbolic form for simplicity. Again, the hardened DB node is illustrated as a node with a square symbol around it. One or more read port circuits 602 can be coupled to the RB isolation node of the arrangement. Accordingly, the $RWL_1$ and $RBL_1$ nodes operate as a first read port, in conjunction with the write port formed by the WBL and WBLB nodes. Likewise, the $RWL_2$ and $RBL_2$ nodes operate as a second read port, the $RWL_3$ and $RBL_3$ nodes operate as a third read port, and so on. Thus, in a two-port arrangement, the RF cell has one read port and one write port. In an arrangement having a total of (N+1) ports, the RF cell is provided with N read ports and one write port.

Figure 7:
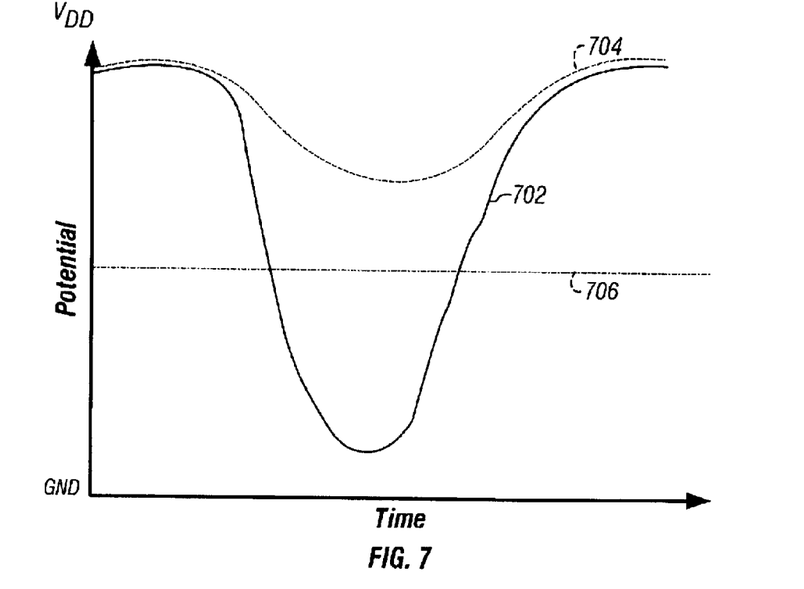
FIG. 7 depicts the voltage characteristics of a data storage node under simulated radiation, which node is hardened in accordance with the teachings of the present invention.

FIG. 7 depicts the voltage characteristics of a data storage node under simulated radiation (e.g., by a triangular current pulse), which node is hardened in accordance with the teachings of the present invention. For example when DB and RB nodes are at $V_{DD}$ (see FIG. 5A), let us assume a radiation strike at RB. The NMOS junction at the RB node is pulled to ground, as exemplified by curve 702. In fact, the voltage level thereat goes below the write trip potential 706 of the storage node. However, this effect is diluted when transferred to DB because of the weak isolation device. Accordingly, the voltage level of DB node goes down only by a small fraction, which does not trip the logic level thereat. This relationship is graphically exemplified by curve 704.

Based on the foregoing, it should be appreciated that the present invention advantageously provides a simple yet efficient radiation hardening design that overcomes the various deficiencies and shortcomings of the state-of-the-art solutions. By providing all PMOS junctions at one or both of the data nodes of a static memory cell, the inherent characteristics of the junction chemistry are beneficially utilized for isolating the deleterious effects of a radiation strike. Since the present invention does not use storage latch duplication, additional capacitive structures or dual interlocked storage latches, no undue costs are incurred in terms of area overhead or high power dissipation. Thus, the present technique is uniquely suitable for deep submicron integration.

It is believed that the operation and construction of the present invention will be apparent from the foregoing Detailed Description. While the embodiments shown and described have been characterized as being preferred, it should be readily understood that various changes and modifications could be made therein without departing from the scope of the present invention as set forth in the following claims.

What is claimed is:

1. A radiation-hardened static memory cell, comprising:
    a first inverter having a first N-channel Metal Oxide Semiconductor (NMOS) device and a first P-channel MOS (PMOS) device, with a first isolation device disposed therebetween;
    a second inverter having a second NMOS device and a second PMOS device, with a second isolation device disposed therebetween, said first and second inverters being cross-coupled together to form a pair of data storage nodes therein,
    wherein a first data storage node is formed at a coupling between said first PMOS device and said first isolation device and a second data storage node is formed at a coupling between said second PMOS device and said second isolation device, said first and second isolation devices operating to be biased at a predetermined level, and
    a first access device coupled to said first data storage node and a second access device coupled to said second data storage node, said first and second data storage nodes operating to hold two complementary data values.

2. The radiation-hardened static memory cell as set forth in claim 1, wherein said first isolation device comprises a PMOS device.

3. The radiation-hardened static memory cell as set forth in claim 1, wherein said second isolation device comprises a PMOS device.

4. The radiation-hardened static memory cell as set forth in claim 1, wherein said first access device comprises a PMOS device.

5. The radiation-hardened static memory cell as set forth in claim 1, wherein said second access device comprises a PMOS device.

6. The radiation-hardened static memory cell as set forth in claim 1, wherein said first and second PMOS devices are formed in an N-well having a predetermined depth.

7. The radiation-hardened static memory cell as set forth in claim 6, wherein said predetermined depth is optimized for hardening said first and second data storage nodes.

8. The radiation-hardened static memory cell as set forth in claim 1, wherein said first data storage node is coupled to a plurality of first access devices and said second data storage node is coupled to a corresponding plurality of second access devices, each pair of first and second accesses forming an access port with respect to said data storage nodes.

9. The radiation-hardened static memory cell as set forth in claim 8, wherein said plurality of first and second access devices comprises two, whereby a dual-port static memory cell is formed.

10. The radiation-hardened static memory cell as set forth in claim 1, wherein said isolation devices are operable in enhancement mode, and further wherein each gate electrode of said isolation devices is biased at $V_{SS}$.

11. The radiation-hardened static memory cell as set forth in claim 1, wherein said isolation devices are operable in enhancement mode, and further wherein each gate electrode of said isolation devices is biased at a negative potential.

12. The radiation-hardened static memory cell as set forth in claim 11, wherein said negative potential ranges around −0.5V to −1.0V.

13. The radiation-hardened static memory cell as set forth in claim 1, wherein said isolation devices are operable in depletion mode.

14. A static memory cell, comprising:
- a pair of inverters cross-coupled to form a pair of data storage nodes;
- means to harden at least one of said pair of data storage nodes by junction isolation, said means including at least a P-Channel Metal Oxide Semiconductor (PMOS) device whose gate is biased at a predetermined negative potential, wherein said PMOS device is electrically connected to said at least one said pair of data storage nodes; and
- an access device coupled to each of said data storage nodes, said data storage nodes operating to hold two complementary data values.

15. The static memory cell as set forth in claim 14, wherein said means to harden said at least one of said pair of data storage nodes includes two PMOS devices, each device operating as an isolation device coupled to a corresponding data storage node.

16. A register file cell having reduced susceptibility to soft error events, comprising:
- a first inverter having a first N-channel Metal Oxide Semiconductor (NMOS) device and a first P-channel MOS (PMOS) device, with a first isolation device disposed therebetween;
- a second inverter having a second NMOS device and a second PMOS device, with a second isolation device disposed therebetween, said first and second inverters being cross-coupled together to form a pair of data storage nodes therein;
- a first access device coupled to a first one of said data storage node pair and a second access device coupled to a second one of said data storage node pair, said first and second data storage nodes operating to hold two complementary data values, wherein said first and second access devices operating to support a write port; and
- two NMOS devices forming at least one read port circuit that is connected to an intermediary node formed at a coupling between said second isolation device and said NMOS device of said second inverter, said two NMOS devices operating to support a read port, wherein said first data storage node is formed at a coupling between said first PMOS device and said first isolation device and said second data storage node is formed at a coupling between said second PMOS device and said second isolation device, said first and second isolation devices operating to be biased at a predetermined level.

17. The register file cell as set forth in claim 16, wherein said first isolation device comprises a PMOS device.

18. The register file cell as set forth in claim 16, wherein said second isolation device comprises a PMOS device.

19. The register file cell as set forth in claim 16, wherein said first access device comprises a PMOS device.

20. The register file cell as set forth in claim 16, wherein said second access device comprises a PMOS device.

21. The register file cell as set forth in claim 16, wherein said isolation devices are operable in enhancement mode, and further wherein each gate electrode of said isolation devices is biased at $V_{SS}$.

22. The register file cell as set forth in claim 16, wherein each gate electrode of said isolation devices is biased at a predetermined negative potential.

23. The register file cell as set forth in claim 16, wherein each of said isolation devices is provided to be operable in depletion mode.

24. The register file cell as set forth in claim 16, further comprising at least two read ports coupled to said intermediary node, wherein each read port is supported by a separate read port circuit having two NMOS devices.

* * * * *